(12) United States Patent
Ohtsuki

(10) Patent No.: US 6,249,477 B1
(45) Date of Patent: Jun. 19, 2001

(54) SEMICONDUCTOR MEMORY DEVICE

(75) Inventor: Tetsuya Ohtsuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/373,177

(22) Filed: Aug. 12, 1999

(30) Foreign Application Priority Data

Aug. 13, 1998 (JP) .................................. 10-229153

(51) Int. Cl.⁷ ..................................................... G11C 8/00
(52) U.S. Cl. ................... 365/230.06; 365/189.09
(58) Field of Search ......................... 365/230.06, 230.03, 365/189.09, 189.11

(56) References Cited

U.S. PATENT DOCUMENTS 5,940,343 * 8/1999 Cha et al. ..................... 365/230.06
6,002,635 * 12/1999 Matano ......................... 365/230.06

FOREIGN PATENT DOCUMENTS 6-309867 11/1994 (JP) .
10-199241 7/1998 (JP) .
11-203858 7/1999 (JP) .
11-283369 10/1999 (JP) .

* cited by examiner

*Primary Examiner*—David Nelms
*Assistant Examiner*—David Lam

(57) ABSTRACT

A semiconductor memory device which employs a double word line system and a negative potential word line system wherein a lowered maximum applied voltage between a gate and a source and between the gate and a drain is used has a sub-word line driving circuit mounted along a main word line and having one transistor controlled so as to be always in the ON state, and which is disposed between another transistor and a sub-word line to control the sub-word line to a positive potential. A threshold voltage of two transistors to control the sub-word line to a negative potential is set so that they are held in the OFF state, when the sub-word is selected. When the sub-word line is not selected, a positive voltage being lower than the above-predetermined positive voltage is applied to their gates.

13 Claims, 16 Drawing Sheets

|  | selected | not selected |
|---|---|---|
| main word line / sub-word line | | |
| selected | MWL =GND<br>MWL'=GND<br>RA =Vpp<br>RAB =GND | MWL =Vcc<br>MWL'=Vpp<br>RA =Vpp<br>RAB =GND |
| not selected | MWL =GND<br>MWL'=GND<br>RA =GND<br>RAB =Vcc | MWL =Vcc<br>MWL'=Vpp<br>RA =GND<br>RAB =Vcc |

| maximum applied voltage between gate and source and between gate and drain | Vpp | Vcc+/Vnb/ |
|---|---|---|
| applied place and input signal level | maximum applied voltage of TrQP1 between gate and source<br><br>RA = Vpp(selected)<br>MWL'=GND(selected) | maximum applied voltage of TrQN1 between gate and drain<br><br>RAB = Vcc(not selected)<br>MWL'=GND(selected) |

FIG.12 (PRIOR ART)

| main word line / sub-word line | selected | not selected |
|---|---|---|
| selected | MWL =Vpp<br>RA =Vpp<br>RAB =Vnb | MWL =Vnb<br>RA =Vpp<br>RAB =Vnb |
| not selected | MWL =Vpp<br>RA =Vnb<br>RAB =Vcc | MWL =Vnb<br>RA =Vnb<br>RAB =Vcc |

FIG.16 (PRIOR ART)

| applied place and input signal level | maximum applied voltage between gate and source and between gate and drain | maximum applied voltage of TrQN32 between gate and drain  RAB =Vnb(selected)  MWL =Vpp(selected) |
|---|---|---|
| | | Vpp+/Vnb/ |

SEMICONDUCTOR MEMORY DEVICE

BACKGROUND OF THE INVENTION

1. Field of the Invention

The present invention relates to a semiconductor memory device and more particularly to a semiconductor memory device using a double word line system and a negative voltage word line system.

2. Description of the Related Art

A demand for high integration of a memory cell is increasing with mass storage on a semiconductor memory device. To respond to the demand, a double word line system has been employed in which a sub-word line driving circuit is provided within a memory cell to divide a main word line composed of metal wiring into a plurality of sub-word lines consisting of polysilicon wiring so that the density of the word line is increased.

FIG. 9 is a block diagram showing a concept of the double word line system. Operations and approximate configurations of the word line system and its driving device in a semiconductor memory device using a double word line system are described hereafter by referring to FIG. 9. Bit lines and their related parts are not shown in the drawing.

A memory cell array 100 of the semiconductor memory device shown in FIG. 9 is provided with main row decoder circuits $101_1$, $101_2$ and so on, and sub row decoder circuits $102_1$, $102_2$ and so on. Any one of the main row decoder circuits $101_1$, $101_2$ and so on is selected depending on an internal address signal and a row decoder control signal. For example, if the main row decoder circuit $101_1$ is selected, the main word line MWL0 connected to the main row decoder circuit $101_1$ is activated. Any one of the sub row decoder circuits $102_1$, $102_2$ and so on is selected depending on the internal address signal and the row decoder control signal. For example, if the sub row decoder circuit $102_1$ is selected, it activates any one of the plural sub-word selection lines in accordance with the address signal. Each of sub-word line driving blocks $103_{11}$, $103_{12}$ and so on has, for example, 4 sub-word line driving circuits and a sub-word line driving circuit selected by a sub-word selection line activates the sub-word line, for example, SWL0 connected to the driving circuit.

The double word line system is used for the following reasons. When the word line is composed of polysilicon wiring, though its wiring pitch can be made small, because the polysilicon wiring is of high electrical resistance, wire delay time at the end of the wiring, if the wiring is long, is increased, thus causing the interference with the improvement of an operating speed of memory.

To solve this problem, the main word line is formed by using metal wiring, which is difficult to make its wiring pitch smaller but being of low electrical resistance, such as aluminum (Al) or the like, and a plurality of sub-word line driving blocks are provided within the memory array to connect memory cells using a short sub-word line extending from each of the sub-word line driving circuits. This enables an increase in word line density as well as in operating speed of memory.

Moreover, in the double word line system as shown in FIG. 9, by selecting the sub row decoder circuits in such a manner that one selected odd-numbered circuit is positioned in parallel with another selected odd-numbered circuit and one selected even-numbered circuit is positioned in parallel with another selected even-numbered circuit, the amount of data to be written and/or read can be increased accordingly.

FIG. 10 is a block diagram showing an example of configurations of a conventional semiconductor memory device. Slightly detailed configurations and operations of the conventional semiconductor memory device employing the double word line system are described below.

The conventional semiconductor memory device shown in FIG. 10 is so figured that it approximately comprises a main row decoder 111, a main word line 112 connected to the main row decoder 111, a sub row decoder circuit 113, a sub-word selection line 114 connected to the sub row decoder circuit 113, more than one, for example, four sub-word line driving circuits 115 constituting one sub-word line driving block connected to the sub-word selection lines 114, a sub-word line connected to each sub-word line driving circuit 115, two or more memory cells 117 horizontally connected to each sub-word line 116 and a bit line 118 vertically connected to each memory cell 117.

The main word line 112 is activated when the main row decoder circuit 111 is selected. Any one of the sub-word selection lines 114 is activated by the selection of the sub row decoder circuit 113 and, as a result, any one of the corresponding sub-word line driving circuits 115 is selected, which activates any one of the sub-word lines 116 connected to the selected sub-word line driving circuit 115. On the other hand, a bit line 118 is activated by a column driving circuit selected (not shown).

A cell transistor QM of the cell memory connected to the activated sub-word line 116 and the activated bit line 118 is turned ON when the sub-word line 116 becomes high (i.e., at a boosted power source potential Vpp) and either of a high-level voltage (power source potential Vcc) or a low-level voltage (ground potential GND) of the bit line is written on a cell capacitor CM, one end of which is connected to a terminal with ½ Vcc. The charge written on the cell capacitor CM, while the sub-word line 116 is low (i.e., at a ground potential), is held in the OFF state by the cell transistor QM.

In the semiconductor memory cell shown in FIG. 10, a threshold voltage Vtn of the cell transistor QM constituting the memory cell 117 is higher than that of peripheral transistors in order to reduce a subthreshold leakage current. Because of this, it is necessary to apply a voltage being higher than "sum of the threshold voltage Vtn of the cell transistor QM and the written voltage Vcc" to the sub-word line 116 connected to a gate of the transistor QM at the time of writing on the memory cell 117, and accordingly the boosted power source potential Vpp being higher than the power source potential Vcc is used as a high-level voltage of the sub-word line 116.

On the other hand, in order to respond to a demand for lowering the voltage to be used, which is increasing with mass storage on a semiconductor, a control of the boosted power source potential Vpp to a lower level is required. To do this, it is necessary to more lower the threshold voltage of the cell transistor QM. To prevent the degradation of hold characteristics of the memory cell attributable to a leakage current generated when the cell transistor QM is OFF which is specifically caused by the lowered threshold voltage Vtn, a negative potential Vnb has come to be instead used as a low-level voltage of the sub-word line 116. In this case, the negative voltage Vnb is conventionally fed by a power source having a voltage different from a substrate voltage. This is because the amount of currents consumed in the case of using the Vnb power source is large and there is a possibility of a great deal of noises caused by clutter at the Vnb potential and, accordingly, the Vnb power source has to be completely and electrically isolated from the Vbb power source to avoid adverse effects on the threshold voltage of the transistor.

FIG. 11 is a block diagram showing configurations of a word line driving system of a conventional semiconductor memory device. FIG. 12 shows levels of signals inputted when a word line is activated in the conventional sub-word line driving circuit.

The conventional word line driving system, as depicted in FIG. 11, is approximately composed of a main row decoder 121, a sub row decoder circuit 122, a sub-word line driving circuit 123 and a negative potential generating circuit 124.

As shown in FIG. 12, the main row decoder circuit 121, when a main word line is selected, is adapted to cause the main word line MWL to be at a boosted power source Vpp in response to an internal address signal and a row decoder circuit control signal and, when the main word line is not selected, to cause the main word line MWL to be at a negative potential Vnb.

Also, as shown in FIG. 12, the sub row decoder circuit 122, when a sub-word selection line is selected, is adapted to cause a sub-word selection line RA to be at a boosted power source potential Vpp and a sub-word selection line RAB to be at a negative potential Vnb in response to the internal address signal and row decoder circuit control signal and, while the sub-word selection line is not selected, to cause the sub-word selection line RA to be at a negative potential Vnb and the sub-word selection line RAB to be at a power source potential Vcc.

The sub-word line driving circuit 123, when both the main word line MWL and the sub-word selection lines RA/RAB are selected, is adapted to cause the sub-word line SWL to be at a boosted power source Vpp, and when either or both of the main word line MWL and the sub-word selection lines RA/RAB are not selected, to cause the sub-word line SWL to be at a negative potential Vnb. The negative potential generating circuit 124 feeds a negative voltage Vnb to a main row decoder circuit 121, a sub row decoder circuit 121 and a sub-word line driving circuit 123. The main row decoder circuit, sub row decoder circuit and sub-word line driving circuit form an X decoder circuit for driving a memory cell array in the direction of X (i.e., in the direction of a word line).

FIG. 13A shows the configuration of a conventional sub-word line driving circuit and FIG. 13B shows the operating timing chart in the conventional sub-word line driving circuit. As shown in FIG. 13A, the conventional sub-word line driving circuit has four N-channel transistors QN31, QN32, QN33 and QN34.

While the main word line MWL and the sub-word selection line RA/RAB are selected, the sub-word line SWL is in the state of writing data on a memory cell. This state is represented by FIG. 13B.

The potential of the main word line MWL, when the main row decoder circuit is selected by an input of an address, changes from its negative potential Vnb to its boosted power source potential Vpp. Since a gate of a transistor QN33 is provided with the boosted power source voltage Vpp, to a gate of a transistor QN31 is fed a voltage obtained by a formula "gate potential of transistor QN33—threshold potential of transistor QN33." At this point, if a potential of a selected sub-word selection line RA changes from Vnb to Vpp, the potential of the gate of the transistor QN31 rises, due to capacitive coupling, approximately to a potential obtained by a formula "gate potential of transistor QN33—threshold voltage of transistor QN33+Vpp−Vnb", and the voltage Vpp of the sub-word selection line RA is transmitted to the sub-word line SWL without any drop of its level.

After the completion of access, because the potential of the sub-word selection line RA changes from Vpp to Vnb and that of the sub-word selection line RAB changes from Vnb to Vcc, the potential of the sub-word line SWL changes from Vpp to Vnb. Then, the potential of the main word line MWL changes from Vpp to Vnb and the sub-word line driving circuit is restored to an unselected state.

While the main word line MWL and/or the sub-word selection lines RA/RAB are not selected, the memory cell is in a state of holding data. While the sub-word line is not selected, since the sub-word selection line RA is at a negative potential Vnb and the sub-word selection line RAB is at a power source potential Vcc, the transistor QN is turned ON and the sub-word line SWL is at a negative potential Vnb. This state remains unchanged even if the main word line MWL is selected or not selected. Moreover, when the main word line MWL is not selected (i.e., at a negative potential Vnb) and when the sub-word selection line RA is selected (i.e., at a boosted power source potential Vpp), in order to prevent the sub-word line SWL from being in a floating state, the sub-word line SWL is adapted to be maintained at the Vnb level by connecting the sub-word line SWL through the transistor QN34 to the main word line MWL.

FIG. 14 shows an example of configurations of a conventional main row decoder. The conventional main row decoder circuit, as shown in FIG. 14, is provided with a gate AND 41, P-channel transistors QP41, QP42, QP43 and QP44, N-channel transistors QN41, QN42, QN43 and QN44, and an inverter INV41.

When the main word line is selected, since all address inputs IN0, IN1, . . . , INm−1 go high and an output of the AND gate AND41 goes high, a transistor QN41 is turned ON and a potential of a connection point of the transistor QP41 and QN41 is at a ground potential GND, thus causing a transistor QP44 to be turned ON and a boosted power source voltage Vpp to be outputted to the main word line MWL.

On the other hand, while the main word line is not selected, since any one of the address inputs IN0, IN1, . . . , INm−1 does not become high, the output of the AND gate AND 41 goes low and a power source potential Vcc of the inverter 41 is fed to a gate of the transistor QN42 through the inverter INV41 and, as a result, the transistor QN42 is turned ON, causing a potential of a connection point of the transistor QP42 and QN42 is at a ground potential GND. This causes a transistor 43 to be turned ON and a potential of a connection point of the transistor QP43 and QN43 is at a boosted power source potential Vpp and, as a result, a transistor QN44 is turned ON and a negative voltage Vnb is outputted to the main word line MWL.

FIG. 15 shows an example of configurations of a conventional sub row decoder circuit. The conventional sub row decoder circuit, as shown in FIG. 15, is provided with an AND gate AND 51, P-channel transistors QP51, QP52, QP53 and QP54, N-channel transistors QN51, QN52, QN53 and QN54, and an inverter INV 51.

When the sub-word selection line is selected, since all address inputs IN0, IN1, . . . , INn−1 go high and an output of the AND gate AND51 goes high, a ground voltage GND is fed to a gate of the transistor QP52 through the inverter INV51 and the transistor QP52 is turned ON, and a potential of a connection point of the transistors QP52 and QN52 is at a power source potential Vcc, thus causing the transistor 53 to be turned ON and a connection point of the transistors QP53 and QN53 is at a negative potential Vnb and, as a result, the transistor QP54 is turned ON and a boosted power source voltage Vpp is outputted to the sub-word selection line RA.

Furthermore, when the point of connections of the transistors QP52 and QN52 is at the power source potential Vcc, the transistor QN51 is turned ON, causing the negative voltage Vnb to be outputted to the sub-word selection line RAB.

On the other hand, while the sub-word selection line is not selected, since any one of the address inputs IN0, IN1, . . . , INm−1 is not high, an output of the AND gate AND 51 goes low and a power source potential Vcc is outputted to the sub-word selection line RAB, causing the transistor QN54 to be turned ON and the negative voltage Vnb to be outputted to the sub-word selection line RA. At this point, the transistor QP54 is held in the OFF state.

As described above, the conventional semiconductor memory device presents a problem in that, due to its use of the negative voltage word line system, the maximum applied voltage between the gate and source and between the gate and drain of the transistor constituting the word line driving circuit is high. Moreover, there is a problem in that the consumption of currents of the negative power source in the memory cell array and of its peripheral circuits is large.

FIG. 16 shows the maximum applied voltage between the gate and source and between the gate and drain and the place where the voltage is applied as well as its input signal level in the conventional sub-word line driving circuit.

The maximum applied voltage between the gate and source and between the gate and drain in the sub-word line driving circuit shown in FIG. 13A occurs between the gate and the drain of the transistor QN32. At this point, the input signal level is the negative potential Vnb occurred when the sub-word selection line RAB is selected and the boosted power source potential Vpp occurred when the main word line MWL is selected, and the maximum applied voltage between the gate and source and between the gate and drain is Vpp+|Vnb|. For example, if the power source Vcc=1.8 V, the boosted power source voltage Vpp=2.5 V and the negative voltage Vnb=−0.5 V, the maximum applied voltage between the gate and source and between the gate and drain Vpp+|Vnb| is 3V, accordingly.

Thus, if the maximum applied voltage between the gate and source and between the gate and drain increases, in order to increase a withstand property against the voltage between the gate and source and between the gate and drain, the increase in the thickness of the oxide film at the gate is required. In this case, since the sub-word line driving circuit is mounted within the memory array, it is advantageous from a production viewpoint that the sub-word line driving circuit portion and the memory cell portion have the oxide film with the same thickness therein. However, if the oxide film is required to have such a large thickness as can withstand the increased maximum applied voltage between the gate and source and between the gate and drain, the thickness of the oxide film turns out to be too large with respect to the cell transistor, thus causing the threshold voltage of the cell transistor to drop and a leakage current while data is held to increase and unfavorably leading to the degradation of hold characteristics. Accordingly, it is necessary that the oxide film differs in thickness between the sub-word line driving circuit portion and the memory cell, which naturally makes the production process complex, inevitably causing the increase in the production cost.

Furthermore, as shown in FIG. 13B, in the conventional sub-word line driving circuit, since the negative potential Vnb is used as the low-level voltage of the main word line MWL and sub-word selection lines RA/RAB, the currents flow into the negative power source through the sub-word line driving circuit, causing the increase in the current consumption of the negative power source.

SUMMARY OF THE INVENTION

In view of the above, it is an object of the present invention to provide a semiconductor memory device wherein a maximum applied voltage between a gate and a source and between the gate and a drain is lowered in a sub-word line driving circuit and wherein the consumption of currents of a negative power source is reduced.

According to an aspect of the present invention, there is provided a semiconductor memory device for having a sub-word line driving circuit mounted along a main word line, when a sub-word line is selected, control the sub-word line under the control of the sub-word line driving circuit to a predetermined positive potential and cause a memory cell connected to the sub-word line to be in a writing state and, while the sub-word line is not selected, control the sub-word line to a predetermined negative potential and cause the memory cell to be in a data holding state, comprising:

another transistor controlled so as to be always in the ON state which is disposed between a transistor to control the sub-word line to the predetermined positive potential and the sub-word line in the sub-word line driving circuit;

whereby a threshold voltage of the transistor to control the word line to the negative potential, when the sub-word line is selected, is so set that it is held in the OFF state even if its gate is at a ground potential and, while the sub-word line is not selected, a positive voltage being lower than the predetermined positive potential is applied to the gate.

In the foregoing, a preferable mode is one wherein the predetermined positive potential is higher than sum of a power source potential and the threshold voltage of the transistor to control the word line to the predetermined positive potential and a positive potential being lower than the positive potential is the power source potential.

Also, a preferable mode is one wherein the sub-word line driving circuit is in the selected state when the main word line and a sub-word selection line for the sub-word line driving circuit are selected and it is in the unselected state while the main word line and/or said sub-word selection line are not selected.

Also, a preferable mode is one wherein the main word line consists of a first main word line and a second main word line and the sub-word selection line consists of a first sub-word selection line and a second sub-word selection line and wherein, when the main word line is selected, the first and second main word lines go low in response to a clock, while, when the main word line is not selected, the first and second main word lines go high and, when the sub-word selection line is selected, the first sub-word selection word line goes high in response to a clock and the second sub-word selection word line goes low in response to a clock, while, when the sub-word selection line is not selected, the first sub-word selection line goes low and the second sub-word selection line goes high.

Also, a preferable mode is one wherein a high-level voltage of the first main word line is a power source potential and a low-level voltage of the same is a ground potential, and a high-level voltage of the second main word line is a boosted power source potential being higher than the power source potential and its low-level voltage is a ground potential and wherein a high-level voltage of the first sub-word selection line is the boosted power source potential and its low-level voltage is a ground potential while a high-level voltage of the second sub-word selection line is a power source potential and its low-level voltage is a ground potential.

Also, a preferable mode is one wherein the sub-word line driving circuit is provided with first and second P-channel transistors and with first and second N-channel transistors, and the first P-channel transistor with its gate connected to the second main word line is disposed between the first sub-word selection line and the second P-channel transistor while the second P-channel transistor with its gate connected to ground is disposed between the first P-channel transistor and the sub-word line, and further the first N-channel transistor with its gate connected to the second sub-word selection line is disposed between the sub-word line and a terminal with a negative potential while the second N-channel transistor with its gate connected to the first main word line is disposed between the sub-word line and a terminal with a negative potential.

Furthermore, a preferable mode is one wherein a threshold voltage of the first and second N-channel transistors is so set that they are held in the OFF state even if their sources are at a negative potential and their gates are at a ground potential.

BRIEF DESCRIPTION OF THE DRAWING

The above and other objects, advantages and features of the present invention will be more apparent from the following description taken in conjunction with the accompanying drawings, in which:

FIG. 2 shows levels of signals inputted when a word line is activated in a sub-word line driving circuit constituting the word line driving system;

FIG. 8 shows a maximum applied voltage between a gate and source and between the gate and a drain in the sub-word line driving circuit;

FIG. 12 shows levels of signals inputted when the word line is activated in the conventional sub-word line driving circuit;

FIG. 16 shows a maximum applied voltage between the gate and source and between the gate and drain, places where voltages are applied and input signal values in the conventional sub-word line driving circuit.

DETAILED DESCRIPTION OF THE PREFERRED EMBODIMENTS

Best modes of carrying out the present invention will be described in further detail using an embodiment with reference to the accompanying drawings.

Figure 1:
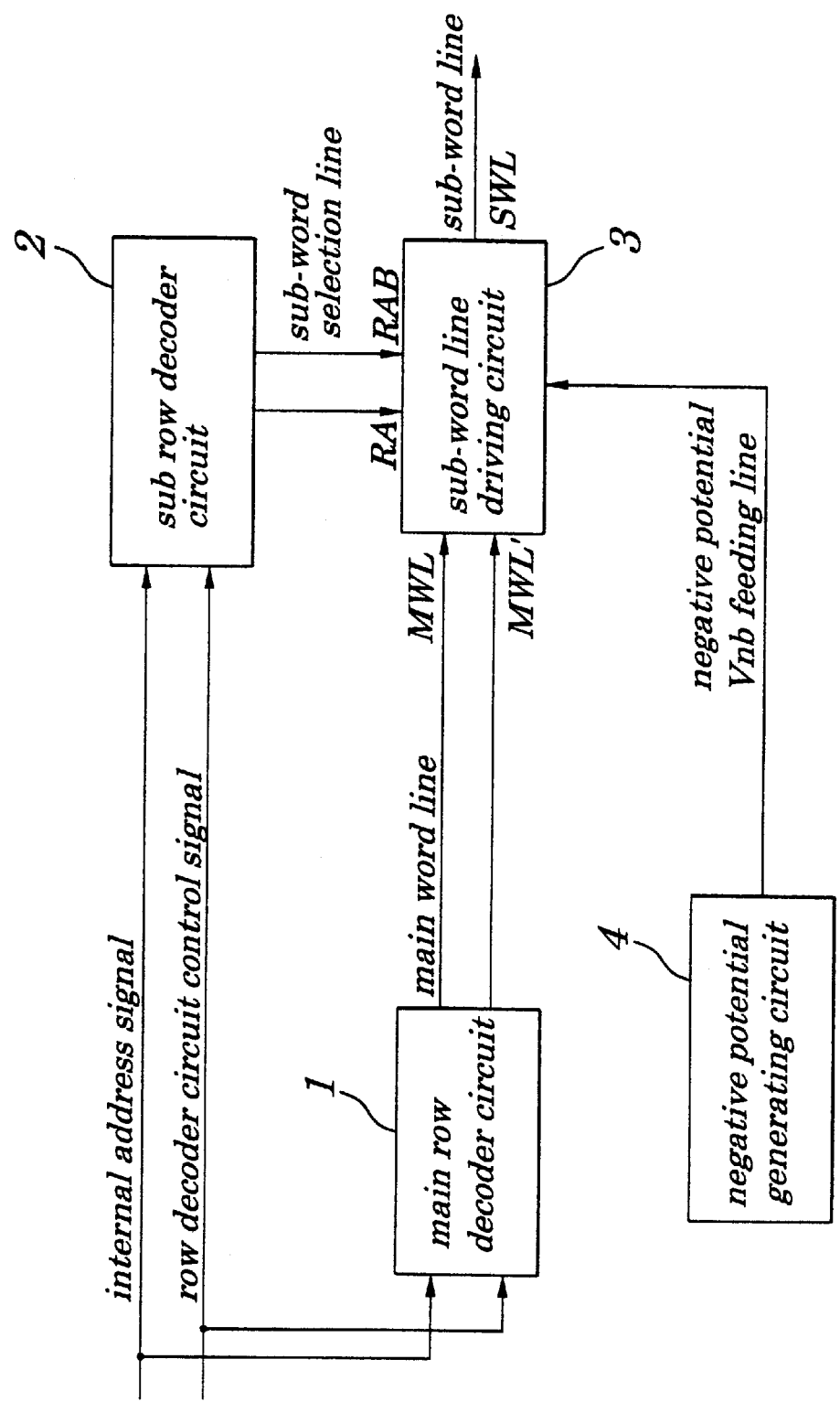
FIG. 1 is a block diagram showing a word line driving system of a semiconductor memory device according to an embodiment of the present invention.

FIG. 1 is a block diagram showing a word line driving system of a semiconductor memory device according to an embodiment of the present invention. FIG. 2 shows levels of input signals of a sub-word line driving circuit when the word line is activated. As depicted in FIG. 1, the word line driving system is composed approximately of a main row decoder circuit 1, a sub row decoder 2, a sub-word line driving circuit 3 and a negative potential generating circuit 4.

As shown in FIG. 2, the main row decoder 1, when a main word line is selected, is adapted to cause main word lines MWL and MWL' to be at a ground potential GND in response to an internal address signal and a row decoder circuit control signal and, while the main word line is not selected, to cause the main word lines MWL and MWL' to be at a power source potential Vcc and at a boosted power source potential Vpp respectively. The sub row decoder 2, when a sub-word line is selected, is adapted to cause a sub-word selection line RA to be at the boosted power source potential Vpp and a sub-word selection line RAB to be at the ground potential GND in response to the internal address signal and the row decoder circuit control signal and, while the sub-word line is not selected, to cause the sub-word selection line RA to be at the ground potential GND and the sub-word selection line RAB to be at the power source potential Vcc. The sub-word line driving circuit 3 operates to cause a sub-word line SWL to be at the boosted power source potential Vpp when the main word lines MWL and MWL' and both the sub-word lines RA and RAB are selected and, when either or both of the main word lines MWL/MWL' and the sub-word selection lines RA/RAB are not selected, to cause the sub-word line SWL to be at the negative potential Vnb. The negative potential generating circuit 4 feeds the negative voltage Vnb to the sub-word line driving circuit 1.

Figure 3A:
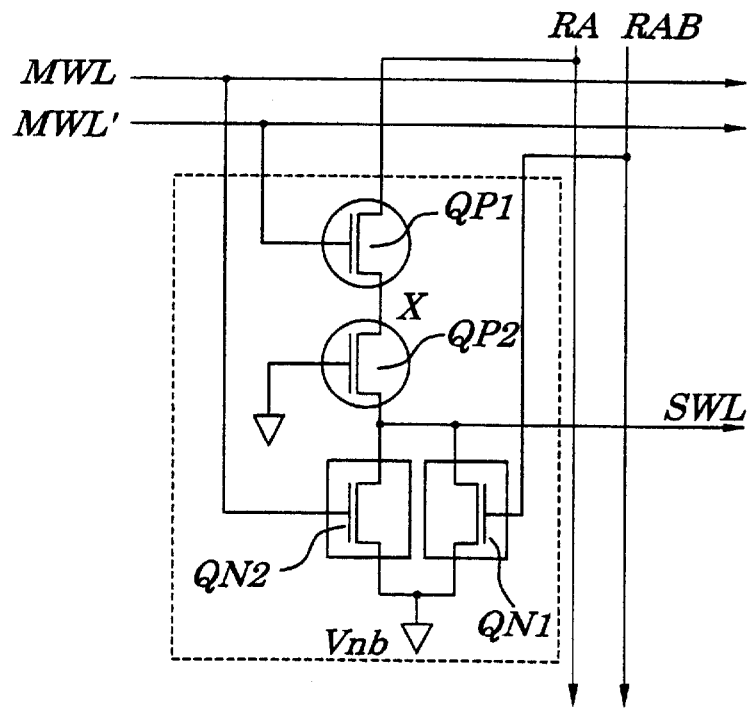
FIG. 3A illustrates the sub-word line driving circuit constituting the word line driving system.
Figure 3B:
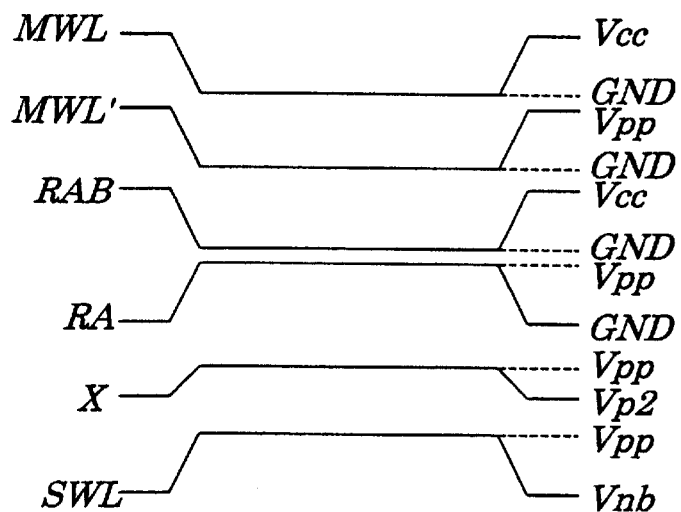
FIG. 3B shows an operating timing chart of the same when each sub-word line is selected in the sub-word line driving circuit.
Figure 4A:
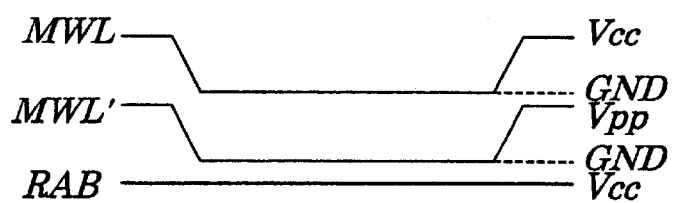
FIGS. 4A, 4B and 4C show respectively operating timing charts used when the sub-word line is not selected in the sub-word line driving circuit.
Figure 4A:
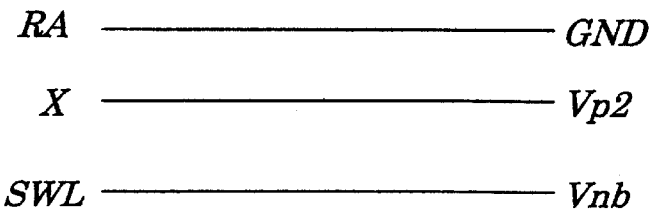
Figure 4B:
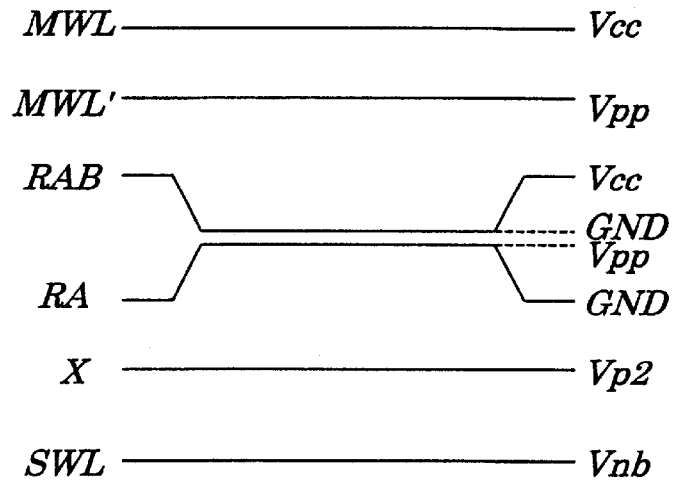
Figure 4C:
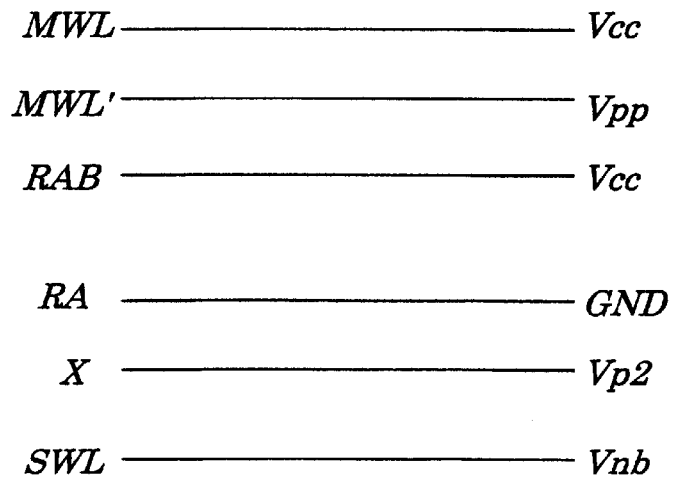

FIG. 3A illustrates a circuit configuration of the sub-word line driving circuit and FIG. 3B shows an operating timing chart of the same when each line is selected. FIGS. 4A, 4B and 4C show respectively timing charts of the sub-word line driving circuit when each line is not selected.

As shown in FIG. 3A, the sub-word line driving circuit is provided with two P-channel transistors QP1 and QP2, and two N-channel transistors QN1 and QN2. The transistor QP1 is connected between the sub-word selection line RA and the transistor QP2, and its gate is connected to the main word line MWL'. The transistor QP2 is connected between the transistor QP1 and the sub-word line SWL, and its gate is connected to ground. The transistor QN1 is connected between the sub-word line SWL and a terminal with a negative potential VnB, and its gate is connected to the sub-word selection line RAB. The transistor QN2 is connected between the sub-word line SWL and a terminal with a negative potential Vnb, and its gate is connected to the main word line MWL.

The operations of the above sub-word line driving circuit are hereafter described referring to FIGS. 3A, 3B, 4A, 4B and 4C.

In the sub-word line driving circuit, the P-channel transistor QP2, which is controlled, with its gate being connected to ground, so as to be always in the ON state, is connected between the P-channel QP1 to pull up the potential of the sub-word line and the sub-word line SWL. The N-channel transistors QN1 and QN2 to pull down the potential of the sub-word line can be in the OFF state even if their sources are at a negative potential Vnb and their gates are at a ground potential by holding their threshold voltage higher than that in the conventional method.

When the main word lines MWL and MWL' and the sub-word selection lines RA and RAB are selected, the sub-word line SWL is in a state that it writes data on a memory cell, and a change in a potential level at each portion at this point is as shown in FIG. 3B. That is, when the main word lines MWL and MWL' and the sub-word selection lines RA and RAB are selected, in accordance with a change of a clock of the internal address, the potential of the main word line MWL changes from the power source potential Vcc to the ground potential GND, that of the main word line MWL' changes from the boosted power source potential Vpp to the ground potential GND, that of the sub-word selection line RA changes from the ground potential GND to the boosted power source potential Vpp and that of the sub-word selection line RAB changes from the power source potential Vcc to the ground potential GND. As a result, the potential of the sub-word line SWL is switched from the negative potential Vnb caused by the ON state of the transistor QN1 to the boosted power source Vpp caused by the ON state of the transistors QP1 and QP2. After the completion of access, when the main word lines MWL and MWL' and the sub-word selection lines RA and RAB are restored to their original states, the potential of the sub-word line SWL changes from the boosted power source potential Vpp to the negative potential Vnb, bringing the sub-word line driving circuit to a state in which data is held.

On the other hand, when the main word line is selected and the sub-word selection line is not selected, as shown in FIG. 4A, in accordance with a change in a clock of the internal address, the potential of the main word line MWL changes from a power source potential Vcc to a ground potential GND and the potential of the main word line MWL' changes from a boosted power source potential Vpp to the ground potential GND, however, the sub-word selection line RA is maintained at the ground potential GND and the sub-word selection line RAB is maintained at the power source potential Vcc and, as a result, the transistor QN1 is turned ON, thus maintaining the sub-word line SWL at a negative potential Vnb.

Also, when the main word line is not selected and when the sub-word selection line is selected, as shown in FIG. 4B, the potential of the sub-word selection line RA changes from the ground potential GND to a boosted power source potential Vpp and that of the sub-word selection line RAB changes from the power source potential Vcc to the ground potential GND, however, the main word line MWL is maintained at the power potential Vcc and the main word line MWL is maintained at the boosted power source potential Vpp and, as a result, the transistor QN2 is turned ON, maintaining the sub-word line SWL at a negative potential Vnb.

Moreover, when the main word line is not selected and when the sub-word selection line is not selected, as shown in FIG. 4C, the main word line MWL is maintained at the power source potential Vcc, the main word line MWL' is maintained at the boosted power source potential Vpp, the sub-word selection line RA is maintained at the ground potential GND, and the sub-word selection line RAB is maintained at the power source potential Vcc and, as a result, the transistors QN1 and QN2 are turned ON, maintaining the sub-word line SWL at the negative potential Vnb.

Additionally, as depicted in FIGS. 3B, 4A, 4B and 4C, "X" represents a connection point of the transistors QP1 and QP2 and a potential of the connection point, while a writing is performed, is at a boosted power source potential Vpp and, except when the writing is carried out, its potential is at Vp2 being equal to a threshold voltage of the transistor QP2.

Figure 5:
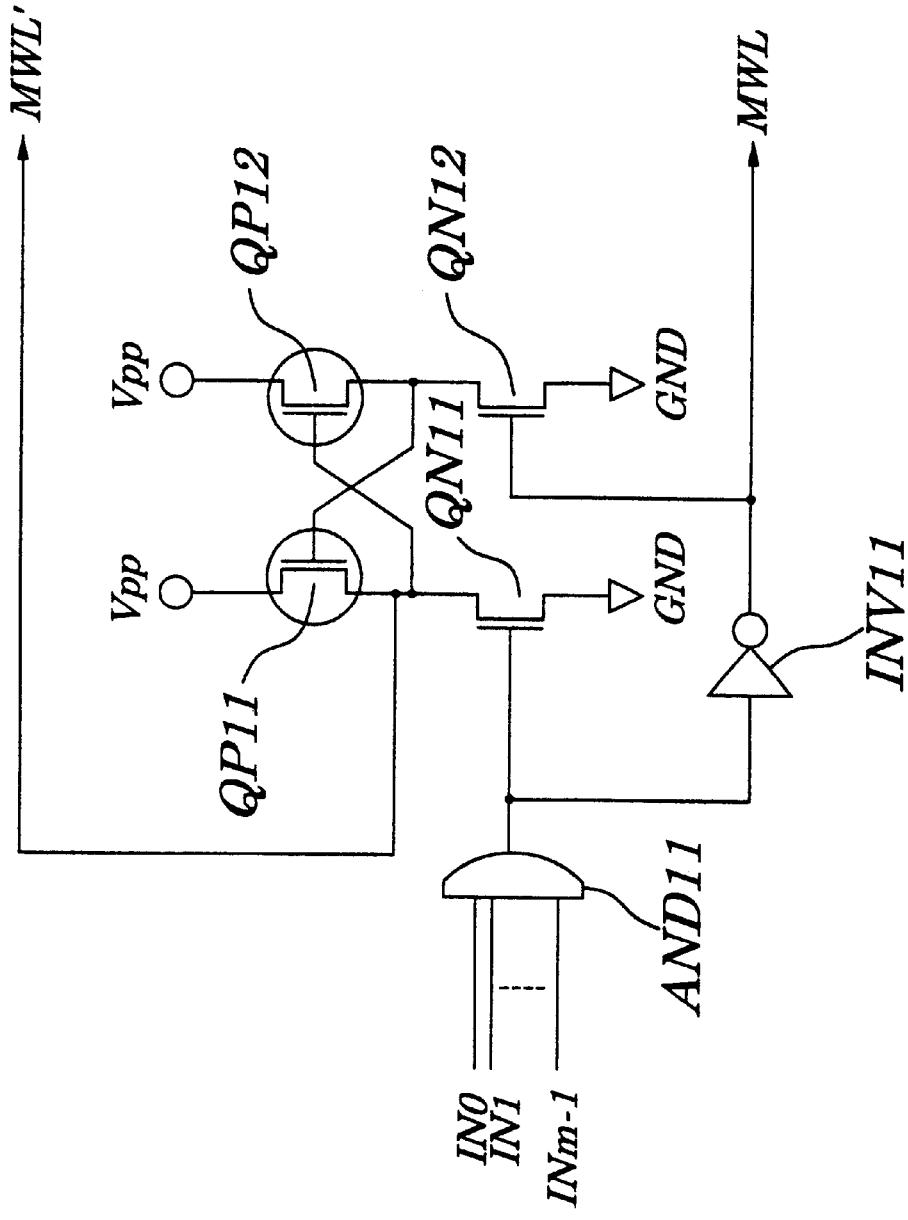
FIG. 5 is a circuit diagram showing a main row decoder constituting the word line driving system.

FIG. 5 shows the main row decoder circuit according to the embodiment. The main row decoder, as shown in FIG. 5, is provided with an AND gate AND11, P-channel transistors QP11 and QP12, N-channel transistors QN11 and QN12, and an inverter INV11.

The transistor QN11 is connected between the transistor QP11 and a ground potential GND, and its gate is connected to an output of the AND gate 11. The transistor QN12 is connected between the transistor QP12 and the ground potential GND, and its gate is connected, through the inverter INV11, to the output of the AND gate AND11. The transistor QP11 is connected between a terminal with a boosted power source Vpp and the transistor QN11, and its gate is connected to a connection point of the transistor QP12 and the transistor QN12. The transistor QP12 is connected between the terminal of the boosted power source Vpp and the transistor QN12, and its gate is connected to a connection point of the transistors QP11 and QN11. The transistor QN12 is connected between the transistor QP12 and the ground potential GND, and its gate is connected, through the inverter INV11, to the output of the AND gate AND11.

Operations of the main row decoder circuit are described hereafter referring to FIG. 5. When the main word line is selected, since all address inputs IN0, IN1, ..., INm−1 go high and the output of the AND gate AND 11 goes high, a ground voltage GND being a low-level output of the inverter INV11 is outputted to the main word line MWL and the transistor QN11 is turned ON, causing the potential voltage GND to be outputted to a main word line MWL'.

On the other hand, while the main word line is not selected, since any of address inputs IN0, IN1, ..., INm−1 does not go high, the output of the AND gate AND11 goes low and a power source voltage Vcc being a high-level output of the inverter INV 11 is outputted to the main word line MWL and, at the same time, the transistor QN12 is turned ON and the connection point of the transistors QP12 and QN12 is at the ground potential GND and, as a result, the transistor QP11 is turned ON, causing a boosted power source voltage Vpp to be outputted to the main word line MWL'.

Figure 6:
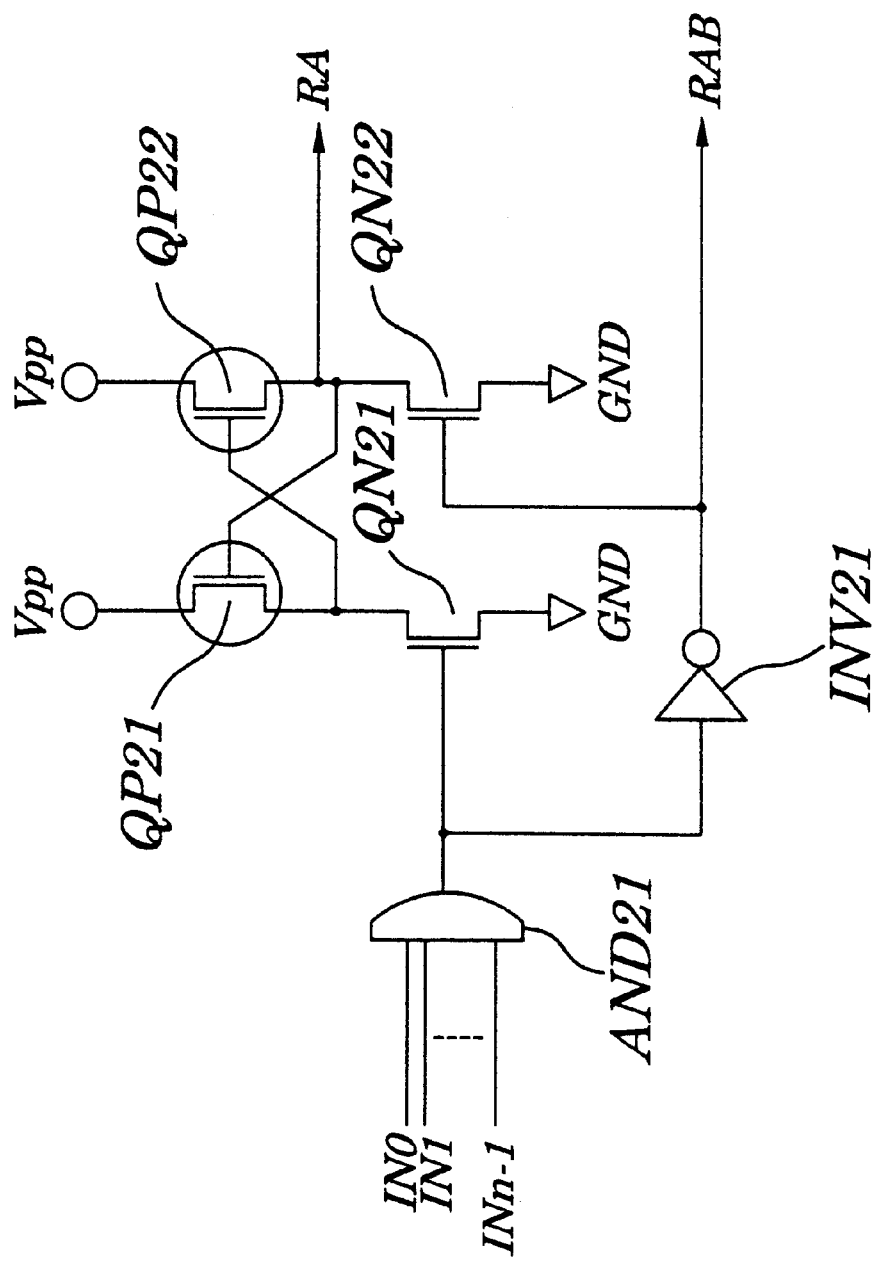
FIG. 6 is a circuit diagram showing a sub row decoder constituting the word line driving system.

FIG. 6 shows the sub row decoder circuit according to the embodiment. The sub row decoder circuit, as shown in FIG.

6, is provided with an AND gate AND 21, P-channel transistors QP21 and QP22, N-channel transistors QN21 and QN22 and an inverter INV21. The transistor QN21 is connected between the transistor QP21 and the ground potential GND, and its gate is connected to an output of the AND gate AND 21. The transistor QN22 is connected between the transistor QP22 and the ground potential GND, and its gate is connected, via the inverter INV21, to the output of the AND gate AND 21. The transistor QP21 is connected between the power source potential Vpp and the transistor QN21, and its gate is connected to a connection point of the transistors QP22 and QN22. The transistor QP22 is connected between a terminal with a boosted power source potential and the transistor Qn22, and its gate is a connection point of the transistors QP21 and QN21.

Operations of the sub row decoder configured above are described referring to FIG. 6. When the sub-word selection line is selected, since all address inputs IN0, IN1, ..., INn–1 go high and the output of the AND gate AND 21 goes high. This causes the transistor QN21 to be ON and, accordingly, the transistors QP21 and QN21 are at the ground potential GND. As a result, the transistor QP22 is turned ON and the boosted power source Vpp is outputted to the sub-word selection line RA. Since the output of the AND gate AND 21 goes high, the ground voltage GND being a low-level output of the inverter INV21 is outputted to the sub-word selection line RAB.

On the other hand, while the sub-word selection line is not selected, since any of address inputs IN0, IN1, ..., INn–1 does not go high, the output of the AND gate AND21 goes low. This causes the power source Vcc being a high-level output of the inverter INV 21 to be outputted to the sub-word selection line RAB and the transistor QN22 to be ON, and the ground voltage GND is outputted to the sub-word selection line RA.

Figure 7:
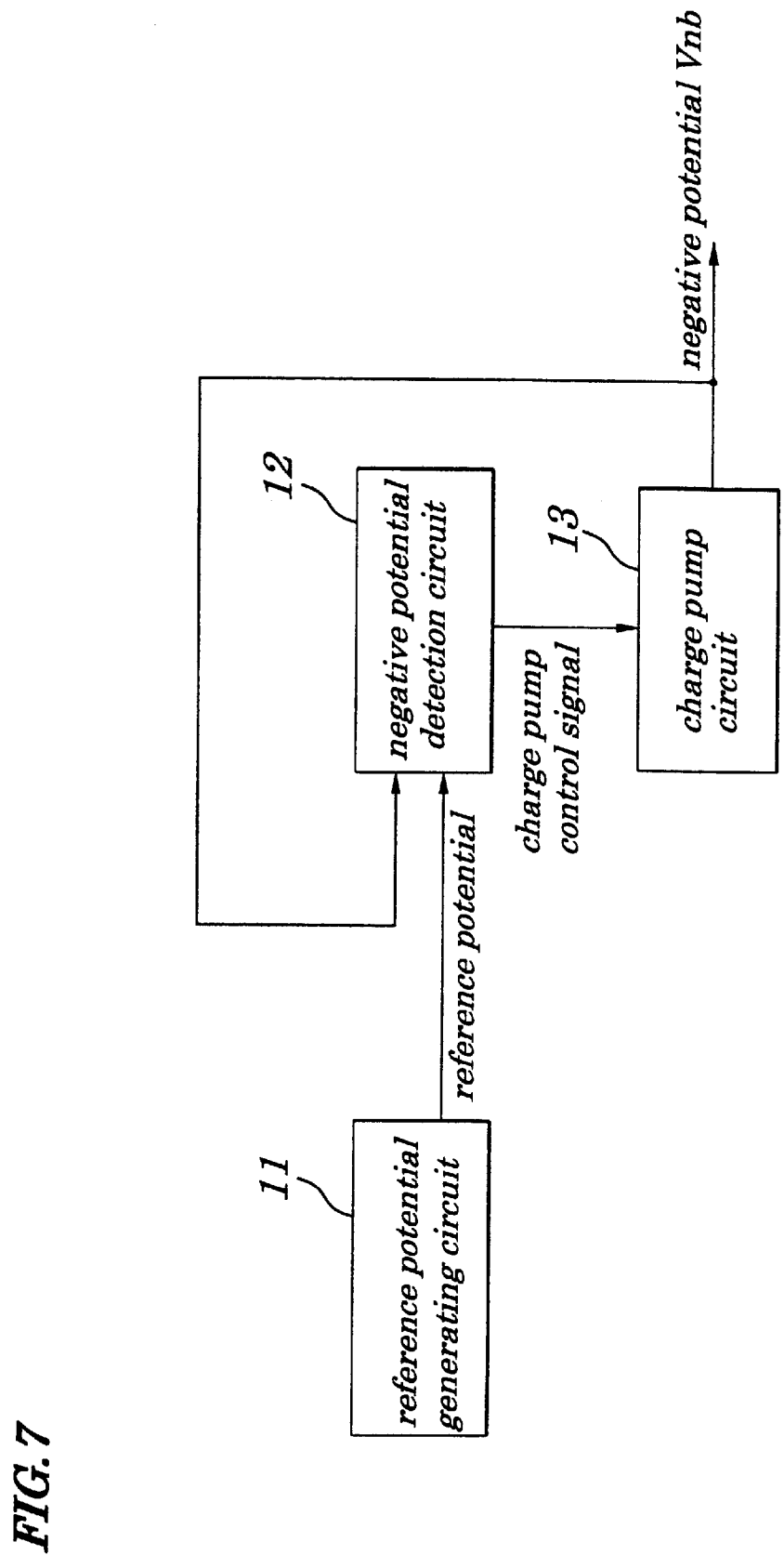
FIG. 7 is a circuit diagram showing a negative potential generating circuit constituting the word line driving system.
Figure 9:
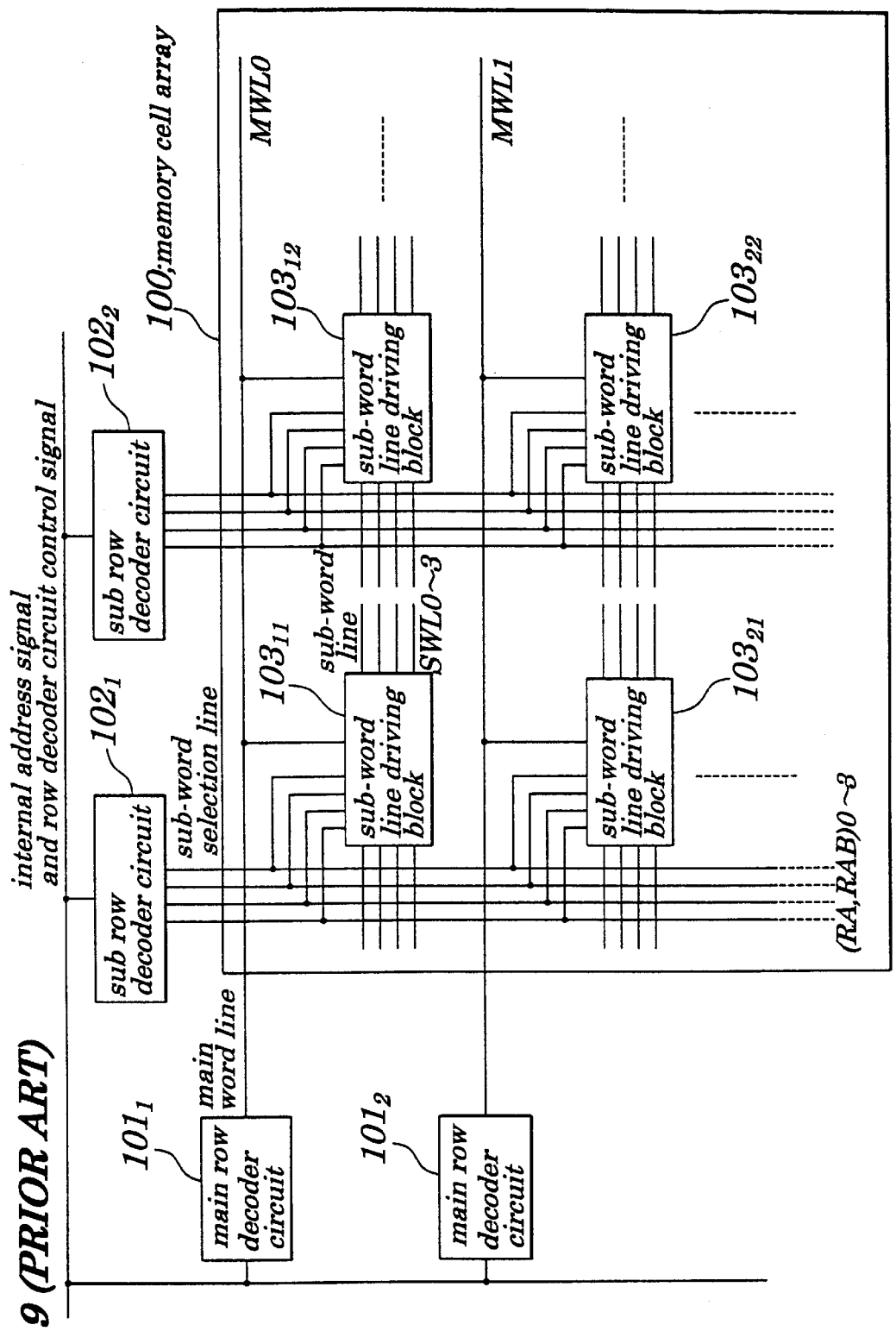
FIG. 9 is a block diagram showing a concept of a conventionally known double word line.
Figure 10:
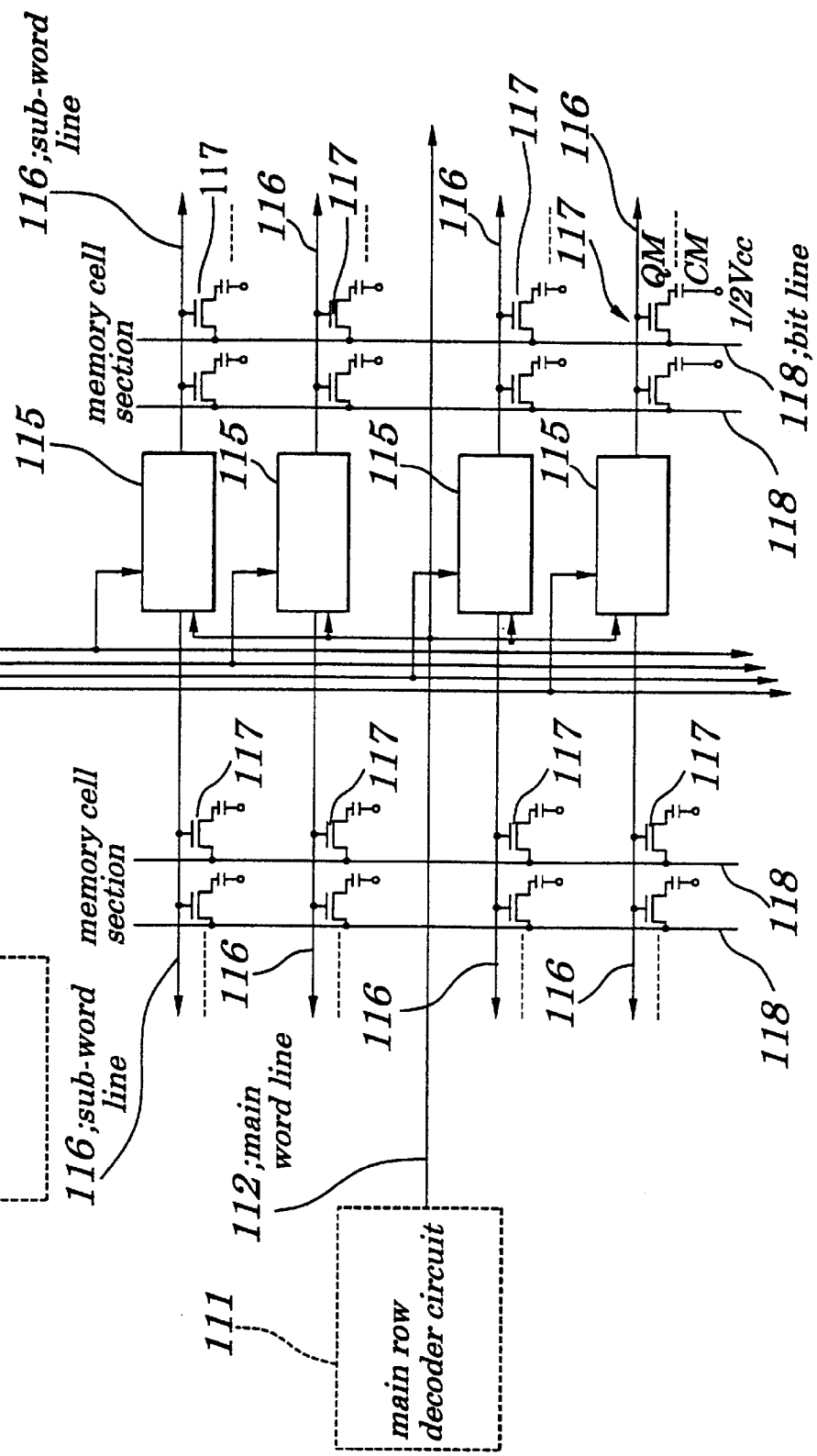
Fig. 10 is a drawing illustrating a conventional semiconductor memory device.
Figure 11:
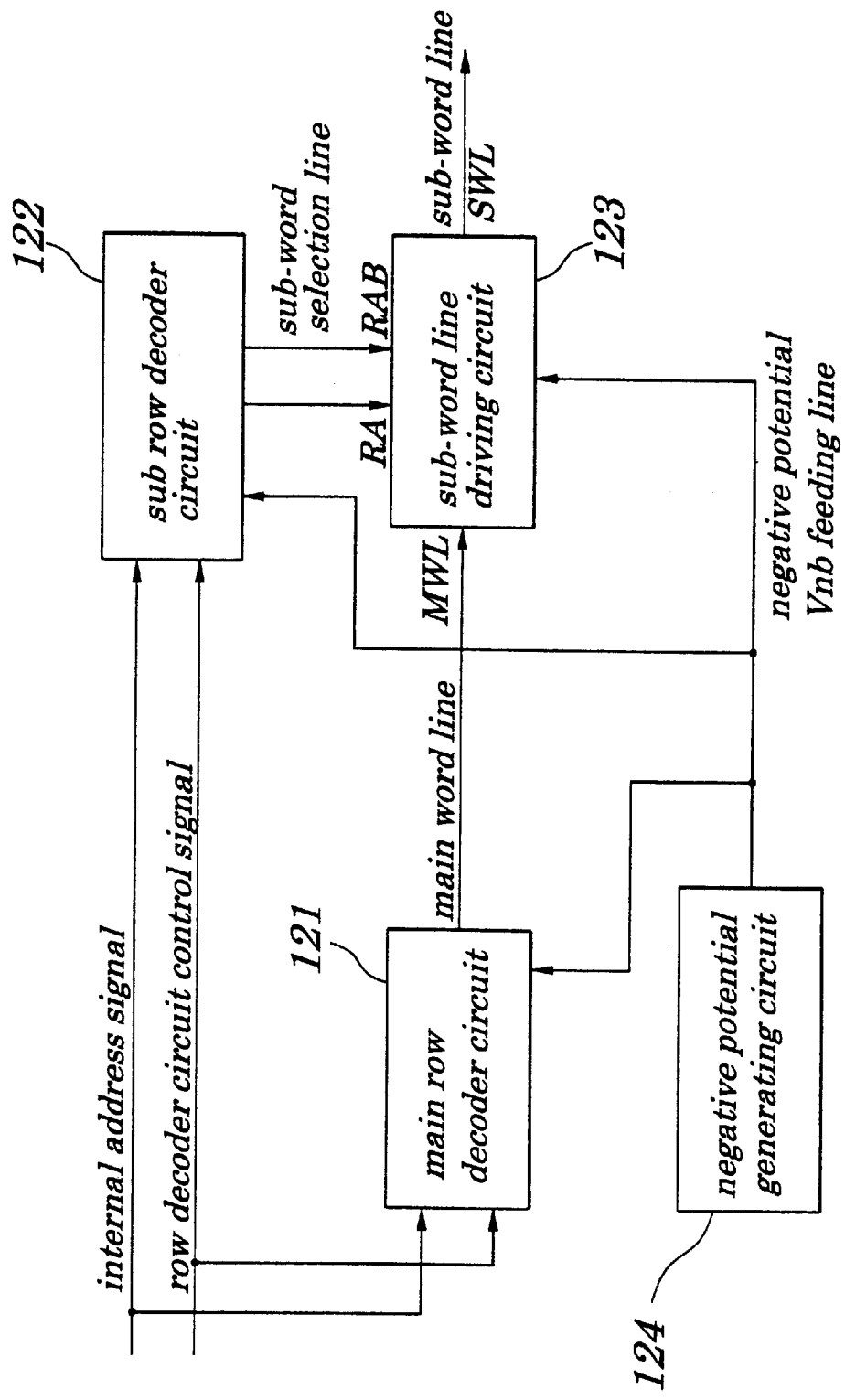
FIG. 11 is a block diagram showing an electrical configuration of the word line driving system in the conventional semiconductor memory device.
Figure 13A:
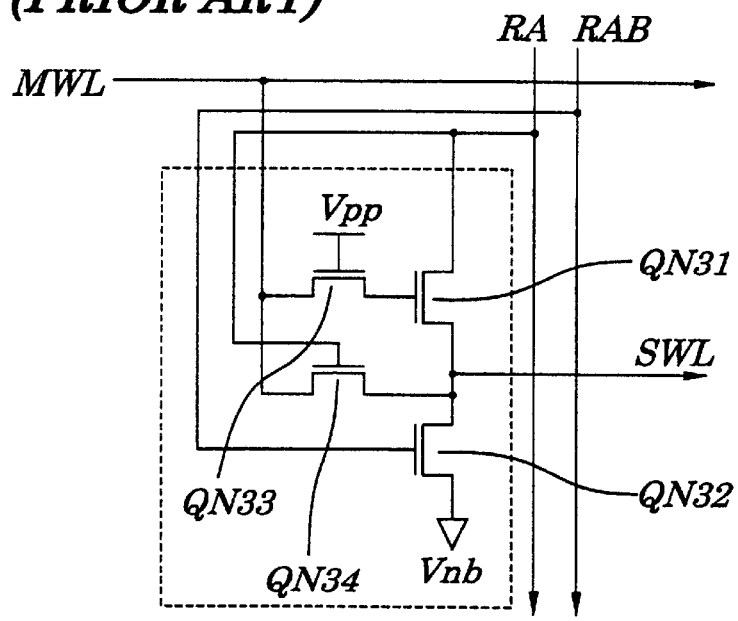
FIG. 13A is a circuit diagram showing an example of the conventional sub-word line driving circuit.
Figure 13B:
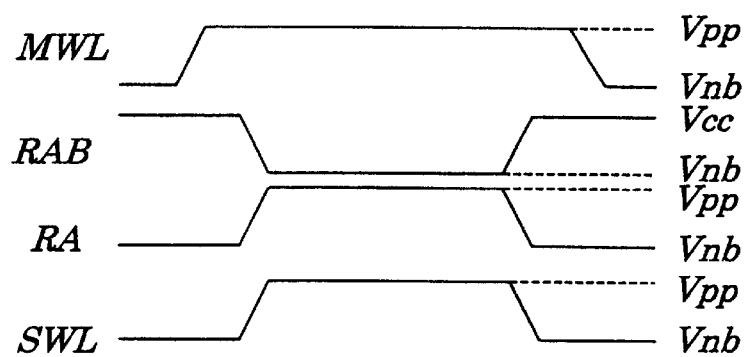
FIG. 13B shows an operating timing chart in the conventional sub-word line driving circuit.
Figure 14:
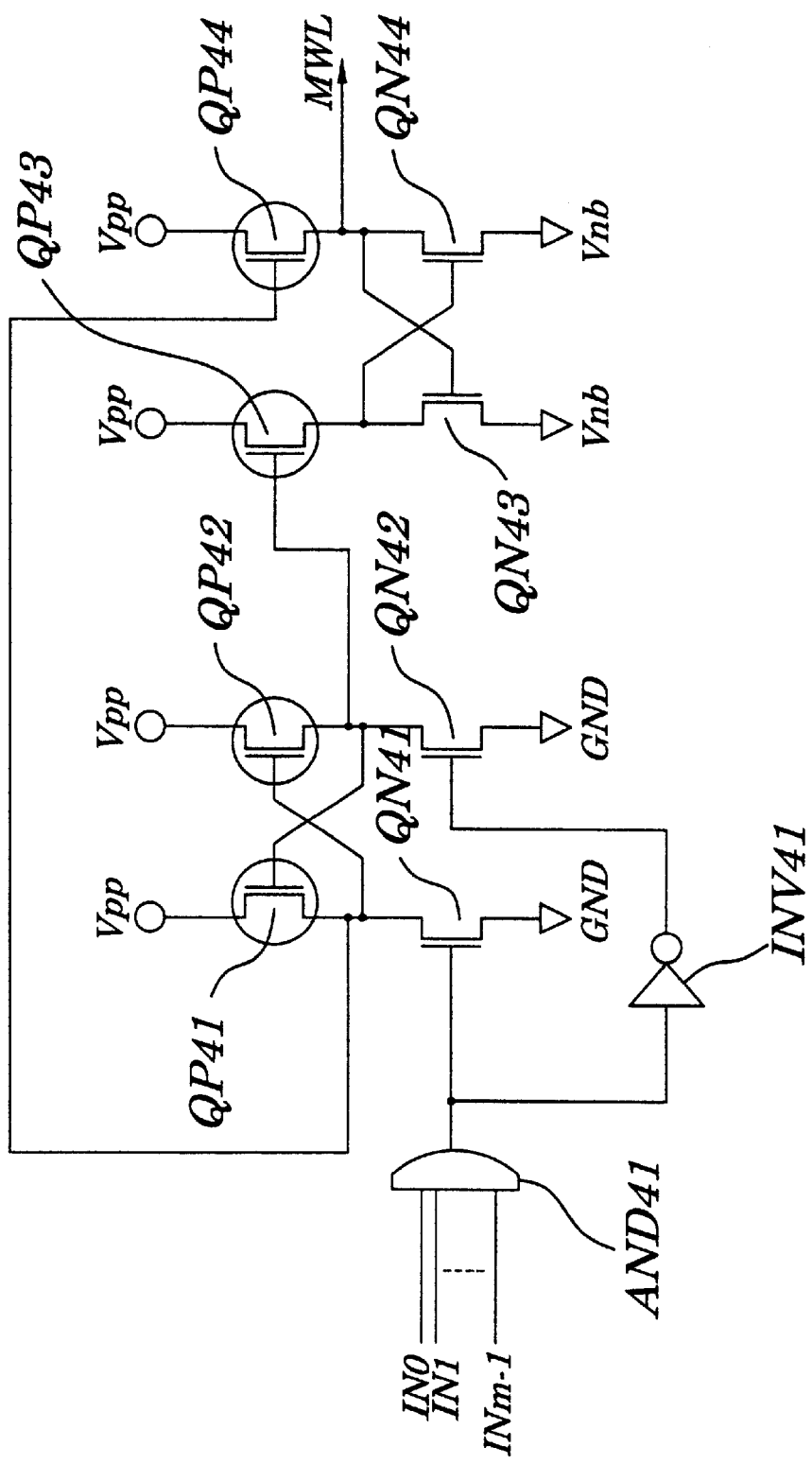
FIG. 14 shows an example of a block diagram of the conventional main row decoder.
Figure 15:
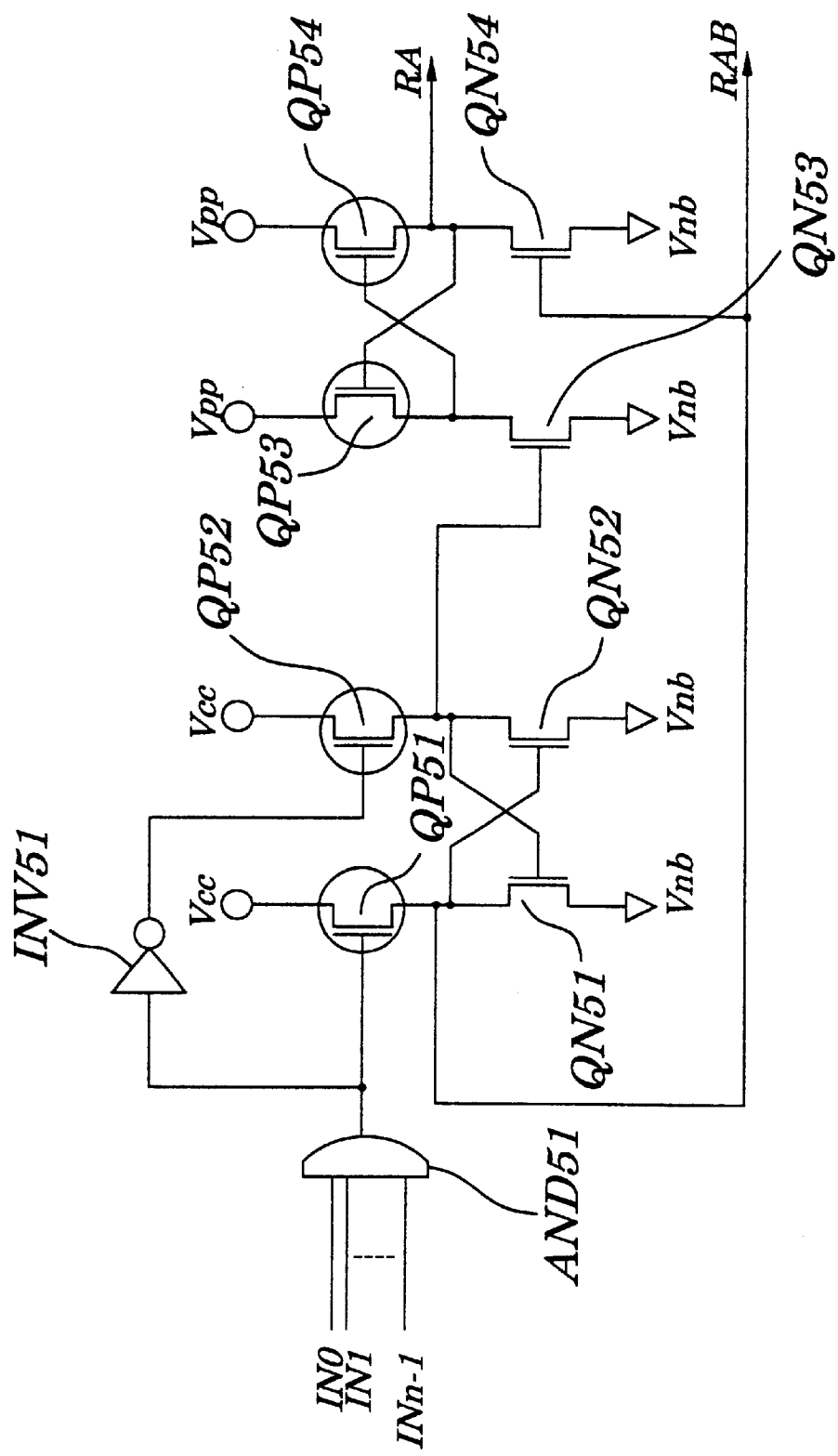
FIG. 15 is an example of a block diagram of the conventional sub row decoder.

FIG. 7 shows a negative potential generating circuit according to the embodiment. The negative potential generating circuit, as shown in FIG. 7, is approximately composed of a reference potential generating circuit 11, a negative potential detection circuit 12 and a charge pump circuit 13.

The reference potential generating circuit 11 is adapted to generate a reference potential (positive potential). The negative potential detection circuit 12 is adapted to detect a difference between the reference potential and an output negative potential Vnb. Based on the difference, it does arithmetic and generates a charge pump control signal to control an output voltage of the charge pump circuit 12. The charge pump circuit 13 is adapted to output a required negative potential Vnb which is changed in response to the charge pump control signal.

FIG. 8 shows a maximum applied voltage between the gate and source and between the gate and drain of the sub-word line driving circuit according to the embodiment. That is, the maximum applied voltage between the gate and the source of the transistor QP1 is a boosted power voltage Vpp and, at this point, the sub-word selection line RA is at a boosted power source potential Vpp as an input signal value (i.e., when the sub-word line is selected) and the main word line MWL' is at a ground potential GND as the input signal value (i.e., when the sub-word line is selected). Moreover, the maximum applied voltage between the gate and the drain of the transistor QN1 is a power source potential Vcc+|Vnb| and, at this point, the sub-word selection line RAB is at a power source potential Vcc as an input signal value (i.e., when the sub-word line is not selected) and the main word line MWL' is at a ground potential GND as the input signal value (i.e., when the sub-word line is selected).

Accordingly, if the power source potential Vcc=1.8 V, the boosted power source potential vpp=2.5 V and the negative potential Vnb=–0.5 V, the maximum applied voltage between the gate and source and between the gate and drain is 2.5 V, which is lower than that in the conventional circuit as shown in FIG. 16.

Thus, in the sub-word line driving circuit of the semiconductor memory device according to the embodiment, by putting the P-channel transistor QP2 controlled so as to be always in the ON state with its gate being connected to ground between the P-channel transistor QP1 to pull up the potential of the sub-word line SWL and the sub-word line SWL, the potential of the connection point X of the transistor QP2 and the transistor QP1 is maintained at Vp2 being a threshold voltage of the transistor QP2 and the maximum applied voltage between the gate and source of the transistor QP1 can be limited to Vpp. If there should be no transistor QP2 here in the circuit, the potential between the gate and source of the transistor QP1 becomes Vpp+|Vnb|, which turns out to be the same as in the conventional circuit and the intended effect of the improvement cannot be produced therefrom.

Moreover, in the sub-word line driving circuit according to the embodiment, by using two lines of MWL and MWL' as the main word line and by employing a high-level voltage of the main word line MWL as the power source potential Vcc and further by keeping the N-channel transistors QN1 and QN2 to pull down the potential of the sub-word line in the OFF state even if their sources are at a negative potential Vnb and their gates are at a ground potential by holding their threshold voltage higher than that in an ordinary case, the maximum applied voltage between the gate and drain of the transistor QN1 can be limited to Vcc+|Vnb|. If the potential of the main word line MWL should be at the boosted power source Vpp here in the circuit, the potential between the gate and source of the transistor QN1 becomes Vpp+|Vnb|, which turns out to be the same as in the conventional circuit and the intended effect of the improvement cannot be produced therefrom.

Furthermore, in the main row decoder circuit and in the sub row decoder circuit, because no negative potential Vnb is used, the maximum applied voltage between the gate and source and between the gate and drain of the transistor constituting the circuit does not exceed the boosted power voltage Vpp.

Thus, in the sub-word line driving circuit, since no negative potential Vnb is used except when a low-level voltage is used as a negative potential Vnb for the sub-word line, the current consumption of the negative power source Vnb is reduced, thereby preventing an effect of noises attributable to clutter caused by each load which would occur if a flow of the negative current Vnb should increase. Additionally, because the wiring for the negative potential Vnb in the main row decoder circuit and the sub row decoder circuit is not required, the reduction of the number of the wiring as a whole is made possible despite the addition of one line to the main word line described above.

It is apparent that the present invention is not limited to the above embodiment but may be changed and modified without departing from the scope and spirit of the invention. For example, the number of the main word line and bit line for a memory cell array and the number of the sub row line driving circuit for every main word line and of the sub-word line may be selected arbitrarily. The N-channel transistor and P-channel transistor employed in the main row decoder, sub row decoder circuit and sub-word line driving circuits also may be arbitrarily replaced with each other As is clear from the above description, according to the semiconductor memory of the present invention, in the whole X decoder containing the sub-word line driving circuit, since the maximum applied voltage between the gate and source and between the gate and drain is limited to the boosted power source voltage Vpp and can be lower compared with the case where the corresponding voltage is Vpp+|Vnb| as in the conventional technology, the increase in thickness of an oxide film between the gate and source and between the gate and drain is not required unlike in the case of the conventional technologies, thus providing advantages from a production viewpoint and preventing the degradation of hold characteristics caused by a decrease in the threshold voltage of the cell transistor attributable to an increase in thickness of the oxide film.

Furthermore, in the X decoder circuit, since no negative potential Vnb is used except when a low-level voltage is used as a negative potential Vnb for the sub-word line, the current consumption of the negative power source can be reduced, preventing effects of noises, which would be caused by an increased current consumption of the negative power source, at the negative potential Vnb, and because the wiring for the negative potential Vnb in the X decoder circuit except for the sub-word line driving circuit is not required, the reduction of the number of the wiring in the semiconductor device is made possible.

According to the present invention, as described above, the semiconductor memory device is so configured that the sub-word line driving circuit disposed along the main word line, when the sub-word line is selected, is adapted to control the sub-word line under the control of the same to a predetermined positive potential and to cause the memory cell connected to the sub-word line to be in a data writing state, while, when the sub-word line is not selected, it controls the sub-word line to a predetermined negative potential and to cause the memory cell to be in a data holding state. Moreover, the semiconductor memory device is also configured so that the sub-word line driving circuit has another transistor controlled so as to be always in the ON state which is disposed between the transistor to control the sub-word line to the predetermined positive potential and the sub-word line and that the threshold voltage of the transistor to control the sub-word line to the negative potential, when the sub-word line is selected, is set so that it is held in the OFF state even if its gate is at the ground potential, while, when the sub-word line is not selected, the positive voltage being lower than the predetermined potential is applied to the gate. Accordingly, the maximum applied voltage between the gate and source and between the gate and drain of the transistor constituting the sub-word line driving circuit can be held lower.

Furthermore, the semiconductor memory device of the present invention is so configured that, in the sub-word line driving circuit, a high-level voltage of the first main word line is used as a power source potential and its low-level voltage as the ground potential, and a high-level voltage of the second main word line is used as the boosted power source potential being higher than the power source potential and its low-level voltage as the ground potential, while a high-level of the first sub-word selection line is used as the boosted power source potential and its low-level voltage as the ground potential, and a high-level voltage of the second sub-word selection line is used as the power source potential and its low-level voltage as the ground potential. This means that a negative potential is not used as a low-level voltage, thus enabling the reduction of the current consumption of the negative power source.

Finally, the present application claims the priority of Japanese Patent Application No. Hei10-229153 filed on Aug. 13, 1998, which is herein incorporated by reference.

What is claimed is:

1. A semiconductor memory device having a sub-word line driving circuit mounted along a main word line, wherein when a sub-word line is selected, said sub-word line is controlled by said sub-word line driving circuit to a predetermined positive potential to cause a memory cell connected to said sub-word line to be in a writing state and, when said sub-word line is not selected, said sub-word line is controlled to a predetermined negative potential to cause said memory cell to be in a data holding state, said sub-word line driving circuit comprising:

a first transistor coupled to said main word line and a second transistor which is controlled so as to be always in the ON state and is disposed between said first transistor and said sub-word line to control said sub-word line to said predetermined positive potential in said sub-word line driving circuit;

whereby a threshold voltage of said first and second transistor to control said sub-word line to said negative potential, when said sub-word line is selected, is set so that they are held in the OFF state even if gates thereof are at a ground potential and, when said sub-word line is not selected, a positive voltage being lower than said predetermined positive potential is applied to said gates.

2. The semiconductor memory device according to claim 1, wherein said predetermined positive potential is higher than a sum of power source potential and the threshold voltage of said second transistor to control said sub-word line to said predetermined positive potential and a positive potential being lower than said positive potential is the power source potential.

3. The semiconductor memory device according to claim 2, further comprising a sub-word selection line for said sub-word line driving circuit, wherein said sub-word line driving circuit is in the selected state when said main word line and said sub-word selection line for said sub-word line driving circuit are selected and it is in the unselected state when said main word line and/or said sub-word selection line are not selected.

4. The semiconductor memory device according to claim 2, wherein said sub-word line driving circuit is in the selected state when said main word line and a sub-word selection line for said sub-word line driving circuit are selected and it is in the unselected state when said main word line and/or said sub-word selection line are not selected.

5. The semiconductor memory device according to claim 2, further comprising a sub-word selection line, wherein said main word line consists of a first main word line and a second main word line and said sub-word selection line consists of a first sub-word selection line and a second sub-word selection line and wherein, when said main word line is selected, said first and second main word lines go low in response to a clock, while, when said main word line is not selected, said first and second main word lines go high and, when said sub-word selection line is selected, said first sub-word selection word line goes high in response to a clock and said second sub-word selection word line goes low in response to a clock, while, when said sub-word selection line is not selected, said first sub-word selection line goes low and said second sub-word selection line goes high.

6. The semiconductor memory device according to claim 5, wherein a high-level voltage of said first main word line is a power source potential and a low-level voltage of said first main word line is a ground potential, and a high-level voltage of said second main word line is a boosted power source potential being higher than said power source potential and its low-level voltage is a ground potential and wherein a high-level voltage of said first sub-word selection line is said boosted power source potential and its low-level voltage is a ground potential while a high-level voltage of said second sub-word selection line is a power source potential and its low-level voltage is a ground potential.

7. The semiconductor memory device according to claim 5, wherein said sub-word line driving circuit is provided with first and second P-channel, transistors and with first and second N-channel transistors, and said first P-channel transistor with a gate thereof connected to said second main word line is disposed between said first sub-word selection line and said second P-channel transistor while said second P-channel transistor with a gate thereof connection to ground is disposed between said first P-channel transistor and said sub-word line, and further said first N-channel transistor with a gate thereof connected to said second sub-word selection line is disposed between said sub-word line and a terminal with a negative potential while said second N-channel transistor with a gate thereof connected to said first main word line is disposed between said sub-word line and a terminal with a negative potential.

8. The semiconductor memory device according to claim 7, wherein a threshold voltage of said first and second N-channel transistors is set so that they are held in the OFF state even if their sources are at a negative potential and their gates are at a ground potential.

9. The semiconductor memory device according to claim 1, further comprising a sub-word selection line coupled to said sub-word line driving circuit, wherein said sub-word line driving circuit is in the selected state when said main word line and said sub-word selection line for said sub-word line driving circuit are selected and it is in the unselected state when said main word line and/or said sub-word selection line are not selected.

10. The semiconductor memory device according to claim 1, further comprising a sub-word selection line for said sub-word line driving circuit, wherein said main word line consists of a first main word line and a second main word line and said sub-word selection line consists of a first sub-word selection line and a second sub-word selection line, and wherein when said main word line is selected, said first and second main word lines go low in response to a clock, while, when said main word line is not selected, said first and second main word lines go high and, when said sub-word selection line is selected, said first sub-word selection word line goes high in response to a clock and said second sub-word selection word line goes low in response to a click, word line goes high in response to a clock and said second sub-word selection word line goes low in response to a click, whereas when said sub-word selection line is not selected, said first sub-word selection line goes low and said second sub-word selection line goes high.

11. The semiconductor memory device according to claim 10, wherein a high-level voltage of said first main word line is a power source potential and a low-level voltage of said first main word line is a ground potential, and a high-level voltage of said second main word line is a boosted power source potential being high than said power source potential and its low-level voltage is a ground potential and wherein a high-level voltage of said first sub-word selection line is said boosted power source potential and its low-level voltage is a ground potential while a high-level voltage of said second sub-word selection line is a power source potential and its low-level voltage is a ground potential.

12. The semiconductor memory device according to claim 10, wherein said sub-word line driving circuit is provided with first and second P-channel transistors and with first and second N-channel transistors, and said first P-channel transistor a gate thereof connected to said second main word line is disposed between said first sub-word selection line and said second P-channel transistor while said second P-channel transistor having a with its gate thereof connected to ground is disposed between said first P-channel transistor and said sub-word line, and further said first N-channel transistor with a gate thereof connected to said second sub-word selection line is disposed between said sub-word line and a terminal with a gate thereof connected to said first main word line is disposed between said sub-word line and a terminal with a negative potential.

13. A semiconductor memory device comprising:
 a main row decoder circuit activatable in response to an internal address signal, for activating a main word line;
 a sub-row decoder circuit activatable in response to an internal address signal, for selecting a sub-word selecting line corresponding to the internal address signal, out of a plurality of sub-word selecting lines;
 a sub-word line driving circuit associated respectively with sub-word lines connected to memory cell transistors in a memory cell array and the sub-word selecting lines, for activating a corresponding one of the sub-word lines when one of the main word lines is activated and a corresponding one of the sub-word selecting lines is selected, and for holding a corresponding one of the sub-word lines at a negative potential when a corresponding one of the sub-word selecting lines is unselected; and
 a negative potential generator for supplying a negative potential to only said sub-word line driving circuit.

* * * * *